United States Patent [19]

Martin

[11] 4,018,613
[45] Apr. 19, 1977

[54] DIODE ENCAPSULATION GLASS
[75] Inventor: Francis W. Martin, Painted Post, N.Y.
[73] Assignee: Corning Glass Works, Corning, N.Y.
[22] Filed: Feb. 6, 1976
[21] Appl. No.: 655,871
[52] U.S. Cl. .................................................. 106/53
[51] Int. Cl.² ........................................ C03C 3/10
[58] Field of Search .............................. 106/53, 49
[56] References Cited
UNITED STATES PATENTS

| | | | |
|---|---|---|---|
| 2,018,816 | 10/1935 | Taylor | 106/53 |
| 2,018,817 | 10/1935 | Taylor | 106/53 |
| 2,210,489 | 8/1940 | Lemmens et al. | 106/53 |
| 2,736,714 | 2/1956 | Tiede | 106/53 |
| 2,830,000 | 4/1958 | Labins | 106/53 |
| 3,535,133 | 10/1970 | Akhtar | 106/53 |
| 3,723,835 | 3/1973 | Davis et al. | 106/53 |

Primary Examiner—Patrick P. Garvin
Assistant Examiner—Mark Bell
Attorney, Agent, or Firm—Kees van der Sterre; Clinton S. Janes, Jr.; Clarence R. Patty, Jr.

[57] ABSTRACT

Small semiconductive devices such as diodes are encapsulated in glass sleeving composed of a $PbO-K_2O-Al_2O_3-B_2O_3-SiO_2$ glass exhibiting good alkali durability and specified thermal expansion characteristics in combination with a reduced softening temperature.

1 Claim, No Drawings

DIODE ENCAPSULATION GLASS

BACKGROUND OF THE INVENTION

The present invention is in the field of diode encapsulation and particularly relates to glass compositions which can be used to encapsulate diodes and other small semiconductive devices at reduced sealing temperatures.

The encapsulation process for which the glasses of the invention are intended comprises the use of short lengths of glass sleeving which are placed over a diode to be encapsulated. The diode consists of a small quantity of a semiconductive material such as silicon with opposing end caps or plugs and lead wires composed, for example, of Dumet alloy. The glass sleeve and diode are then heated to a temperature sufficient to seal the tubing ends to the alloy end plugs or caps, thereby encapsulating the device.

Important properties of glasses to be utilized for this application are glass softening point, chemical durability, coefficient of thermal expansion, and chemical compatibility with semiconductive materials. The softening point should be relatively low to provide effective sealing at temperatures low enough to avoid damage to the semiconductor. The coefficient of thermal expansion of the glass should closely match that of Dumet or other relatively high expansion alloys (about $90 \times 10^{-7}/°$ C.), which are utilized for end caps and lead wires. The chemical durability of the glass should be sufficiently high to resist attack by moisture in use. And the glass should have as low an alkali content as possible, consistent with other requirements, in order to avoid contamination of the semiconductive element. However, potassium is very much less deleterious to device performance than are sodium and lithium.

When it is desired to encapsulate semiconductive devices such as diodes by the sleeving method, additional requirements must be met by the glass. The successful manufacture of the glass tubing fom which the sleeves are cut requires that the glass exhibit reasonable forming characteristics. Glasses with an excessively steep viscosity-temperature relationship (corresponding to a sharp rather than a gradual rise in viscosity as the glass is cooled) cannot readily be formed into glass tubing by commercially practicable methods. High viscosity at the liquidus temperature of the glass is also very important for tube drawing processes. Finally, good resistance to alkaline solutions is required since the tubing manufacturing process includes a washing operation in a strong detergent solution.

Lead silicate glasses have long been utilized in electrical applications because of the relatively low softening points and good electrical insulating properties exhibited thereby. U.S. Pat. Nos. 2,018,817 and 2,018,816 to Taylor, for example, disclose high expansion lead alkali silicate glasses, having softening points in the range of about 580°–645° C. and electrical resistivities above $10^8$ ohm-centimeters, which glasses are useful for fabricating electrical lamp parts.

U.S. Pat. No. 2,642,633 to Dalton describes somewhat softer (lower softening point) glasses in the $PbO–Al_2O_3–B_2O_3–SiO_2$ composition field, referred to as "solder" glasses, which are typically utilized in the form of glass frits to seal together glass parts composed of soda-lime-silica or other relatively high expansion glasses. These solder glasses have the advantage of being free from alkali metals and are high in electrical resistivity, but they typically exhibit somewhat lower chemical durability (resistance to weathering), slightly lower thermal expansion, and less desirable working characteristics than alkali lead silicate glasses.

Hence, while quite suitable for the manufacture of fritted glass or pressed glass parts, the steep viscosity-temperature dependence of the aforementioned solder glasses makes them unsuitable for the manufacture of drawn glass tubing of kind useful for diode encapsulation sleeves. For these glasses, an increase from softening point viscosity ($10^{7.5}$ poises) to annealing point viscosity ($10^{14.5}$ poises) over a cooling interval of 100° C. is not uncommon. This behavior attests to the short working range of these glasses. Moreover, these glasses typically exhibit rather low viscosity at the liquidus, making tube forming difficult. Because of these characteristics, solder glasses used for diode encapsulation have generally been provided in frit form, with sleeving, if required, being produced by sintering fritted glass. U.S. Pat. No. 3,723,835 to Davis et al. illustrates the use of alkali-free lead borosilicate glass frits for diode sealing, while U.S. Pat. No. 3,535,133 to Akhtar shows the direct sealing of low expansion frits to silicon metal.

The advantages of utilizing mass-produced glass tubing to provide sleeves for encapsulating semiconductive devices are well known. Avoiding the need to manufacture, transport and handle powdered glasses, and the liquid vehicles and binders necessary to provide a sintered glass coating from such powders, are of particular commercial importance. Thus alkali-free encapsulation glasses capable of being drawn into tubing have been developed. U.S. Pat. No. 3,493,405 to Thomas describes lead aluminosilicate glasses suitable for semiconductor encapsulation, but these glasses are designed to seal to low expansion metallic components such as Kovar alloy or molybdenum. Hence only relatively low expansion glasses ($45 \times 10^{-7}$ to $55 \times 10^{-7}/°$ C.) having rather high softening temperatures (637°–683° C.) are provided.

For the sleeve encapsulation of semiconductive devices utilizing higher expansion metallic components such as Dumet alloys or the like, lead alkali silicate glasses exhibiting both acceptable working characteristics and reasonable softening properties are required. Glasses presently in use for this purpose are similar in properties to more complex glasses, such as described in U.S. Pat. No. 3,047,410 to Woodall et al., which were designed for use in the manufacture of electronic tubes. One glass which has been commercially employed in the manufacture of tubing for diode encapsulation consists of about 59% PbO, 35.3% $SiO_2$, and 5.7% $K_2O$. This glass has a coefficient of thermal expansion of about $91 \times 10^{-7}°$ C., a softening point of about 580° C., and an annealing point of about 390° C. The working characteristics of the glass are good, as is suggested by the substantial temperature interval (190° C.) between the softening point and the strain point of the glass. However, still softer glasses exhibiting acceptable working characteristics as well as the required thermal expansion and chemical durability are desired.

SUMMARY OF THE INVENTION

I have now discovered a narrow range of glass composition wherein glasses exhibiting reduced softening points, proper thermal expansion, acceptable chemical durability, and good working characteristics may be provided. These glasses consist, in weight percent on the oxide basis, of about 64–66% PbO, 3.5–4% $K_2O$, 27–27.5% $SiO_2$, 1.5–2.5% $Al_2O_3$, and 1.5–2.5% $B_2O_3$.

A glass within the above described composition region exhibits a softening point in the range of about 520°–535° C. and an average linear coefficient of thermal expansion in the range of about 89–93 × $10^{-7}$/° C. The chemical durability of the glass is adequate for diode encapsulation applications, and the glass has an annealing temperature at least about 140° C. below its softening temperature. Thus the glass has a reasonable working range and may readily be formed into glass tubing utilizing conventional tube drawing processes.

DETAILED DESCRIPTION

The properties required for diode encapsulation glasses depend critically upon the composition of the glass, and all of the composition limitations hereinabove set forth must be observed if all of the required properties are to be combined in a single glass. Compositions which are too high in silica exhibit excessively high softening temperatures, while reductions in silica content can produce a glass with poor working characteristics, and may also cause reductions in chemical resistance to alkaline solutions, particularly if insufficient $Al_2O_3$ is present. $Al_2O_3$ is required to maintain the alkali durability of the glass at an acceptable level, but excessive $Al_2O_3$ raises the softening point of the glass. $K_2O$ is required to maintan the required expansion characteristics and softness in the glass, but excessive $K_2O$ reduces durability and may raise the expansion above acceptable levels. $B_2O_3$ is required to reduce the softening point of the glass, countering the effects of $Al_2O_3$, but excessive $B_2O_3$ reduces the chemical durability of the glass. $B_2O_3$ also has the desireable effect of lowering the liquidus temperature of the glass.

The various effects of composition modifications on glass properties are shown in the following Table wherein a glass provided in accordance with the invention is compared with several glasses outside the scope thereof. Included in the Table are the compositions of the glasses, in parts by weight on the oxide basis, the softening points and annealing points of the glasses, the linear coefficients of thermal expansion of the glasses, expressed as an average over the range from 25°–300° C. and the relative resistance of the glasses to chemical attack by alkaline solutions. Included for comparison is a prior art glass used for for diode encapsulation.

All of the glass contained a minor amount (about 0.5% by weight) of $As_2O_3$ as a fining agent for melting, but the amounts remaining in the final glass were negligible and are not reported. The alkali durabilities of the glasses are reported on a relative basis according to the weight loss incurred by a sample of each glass upon exposure to boiling aqueous 0.2 Normal $Na_2CO_3$, with the weight loss incurred by the prior art glass being assigned the value of 1.0 for purposes of comparison. Glasses exhibiting lower relative weight loss values are more durable.

TABLE

| Glass Composition | Prior Art | Invention | Related Glasses | | | | |
| --- | --- | --- | --- | --- | --- | --- | --- |
| | | | A | B | C | D | E |
| PbO | 59.0 | 65.0 | 65.0 | 65.0 | 65.0 | 65.0 | 65.0 |
| $SiO_2$ | 35.3 | 27.0 | 29.0 | 30.0 | 31.0 | 32.0 | 28.0 |
| $K_2O$ | 5.7 | 4.0 | 4.0 | 3.0 | 4.0 | 3.0 | 3.0 |
| $Al_2O_3$ | — | 2.0 | 2.0 | 2.0 | — | — | 2.0 |
| $B_2O_3$ | — | 2.0 | — | — | — | — | 2.0 |
| Glass Properties | | | | | | | |
| Softening Point (° C.) | 580 | 530 | 556 | 574 | 554 | 562 | 551 |
| Strain Point (° C.) | 390 | 385 | 403 | 411 | 396 | 392 | 404 |
| Thermal Expansion (× $10^{-7}$/° C.) | 91 | 90 | 91.1 | 82.5 | 93.0 | 85.8 | 85.0 |
| Alkali Durability (Relative Weight Loss) | 1.0 | .990 | .807 | .765 | 1.67 | .69 | .587 |

From the data set forth in the Table it is apparent that the glass provided in accordance with the invention has a substantially lower softening point than the prior art glass, but still exhibits proper thermal expansion and adequate chemical durability in alkaline solutions. The lower acid durability of the novel glass is not considered to be a critical factor for diode encapsulation applications.

On the other hand, related glasses A–E do not fall within the composition limitations of the invention, and thus do not exhibit the combination of properties desired for diode encapsulation. Glass A, which contains excess silica and no $B_2O_3$, does not show an important improvement over the prior art glass with respect to softening point, while glass B, which is free of $B_2O_3$ and still higher in silica, exhibits both a high softening temperature and low thermal expansion. Glass C, which contains excess silica and no $B_2O_3$ or $Al_2O_3$, exhibits poor alkali durability as well as a high softening point, while glass D, which is similar to C but with increased silica, demonstrates better durability but an even higher softening point and lower thermal expansion. Glass E is also low in thermal expansion.

A specific example of the preparation of glass tubing suitable for providing glass sleeving for diode encapsulation is as follows. A batch for a glass is compounded for melting which contains, in parts by weight, about 1300 parts litharge, 118 parts anhydrous potassium carbonate, 540 parts 200 mesh sand, 60 parts hydrated alumina, 40 parts anhydrous $B_2O_3$, and 10 parts $As_2O_3$. The batch is melted at a temperature of about 1200° C. for about 4 hours to provide a glass consisting, in weight percent, of about 65.0% PbO, 27.0% $SiO_2$, 4.0% $K_2O$, 2.0% $Al_2O_3$ and 2.0% $B_2O_3$. This glass is formed into glass tubing having an inside diameter of about 0.040–0.060 inches by a conventional continuous tube drawing process to provide lengths of tubing which are subsequently cut into short glass sleeves suitable for diode encapsulation.

Glass sleeves produced as described are suitable for the encapsulation of diodes comprising Dumet alloy or other high expansion metallic components in accordance with conventional encapsulation processes, except that substantially reduced sealing temperatures may be employed.

I claim:

1. A glass suitable for the manufacture of glass tubing for diode encapsulation consisting, in weight percent, of about 65% PbO, 27% $SiO_2$, 4% $K_2O$, 2% $Al_2O_3$, and 2% $B_2O_3$, said glass having a softening point of about 530° C., and an average linear coefficient of thermal expansion (25°–300° C.) of about 90 × $10^{-7}$/° C.

* * * * *

UNITED STATES PATENT AND TRADEMARK OFFICE
CERTIFICATE OF CORRECTION

PATENT NO. : 4,018,613

DATED : April 19, 1977

INVENTOR(S) : Francis W. Martin

It is certified that error appears in the above—identified patent and that said Letters Patent are hereby corrected as shown below:

Column 4, line 68, Claim 1, after "530°C.," insert -- a strain point of about 385°C., --.

Signed and Sealed this thirtieth Day of August 1977

[SEAL]

Attest:

RUTH C. MASON
Attesting Officer

C. MARSHALL DANN
Commissioner of Patents and Trademarks